United States Patent [19]

Gubitose et al.

[11] 4,305,725
[45] Dec. 15, 1981

[54] METHOD OF AND APPARATUS FOR OUTGASSING RAW MATERIAL USED TO GROW CRYSTALS

[75] Inventors: Nicholas F. Gubitose, Moosic; Michael J. Zelinka, Mountaintop, both of Pa.

[73] Assignee: RCA Corporation, New York, N.Y.

[21] Appl. No.: 198,833

[22] Filed: Oct. 20, 1980

[51] Int. Cl.³ .......................... C22B 9/05; C30B 29/20
[52] U.S. Cl. ................................ 23/293 R; 23/295 R; 23/305 A; 422/290; 423/600; 423/625
[58] Field of Search ............ 23/293 R, 295 R, 305 A; 422/248, 288, 290, 307, 309; 34/15, 36, 92; 423/600, 625, 628; 106/73.4; 156/DIG. 61; 55/53, 55, 195, 196, 208

[56] References Cited

U.S. PATENT DOCUMENTS

| | | | |
|---|---|---|---|
| 3,011,870 | 12/1961 | Webb et al. | 156/DIG. 61 |
| 3,608,050 | 9/1971 | Carman et al. | 156/DIG. 61 |
| 3,922,872 | 12/1975 | Reilly et al. | 34/15 |
| 3,960,503 | 6/1976 | Rice | 156/615 |
| 3,998,686 | 12/1976 | Meiling et al. | 156/615 |

*Primary Examiner*—Gregory N. Clements
*Attorney, Agent, or Firm*—Birgit E. Morris; Donald S. Cohen; Robert P. Seitter

[57] ABSTRACT

A method and apparatus for outgassing raw materials includes the steps of and means for heating the material to a temperature of about 800° C. and maintaining that temperature for a first bake out period during which the material is maintained at a pressure of about 200 millitorr and for a second bake out period during which the material is maintained at a pressure of about 5 millitorr or less. During the first bake out period, an inert gas is backstreamed through the raw material.

12 Claims, 1 Drawing Figure

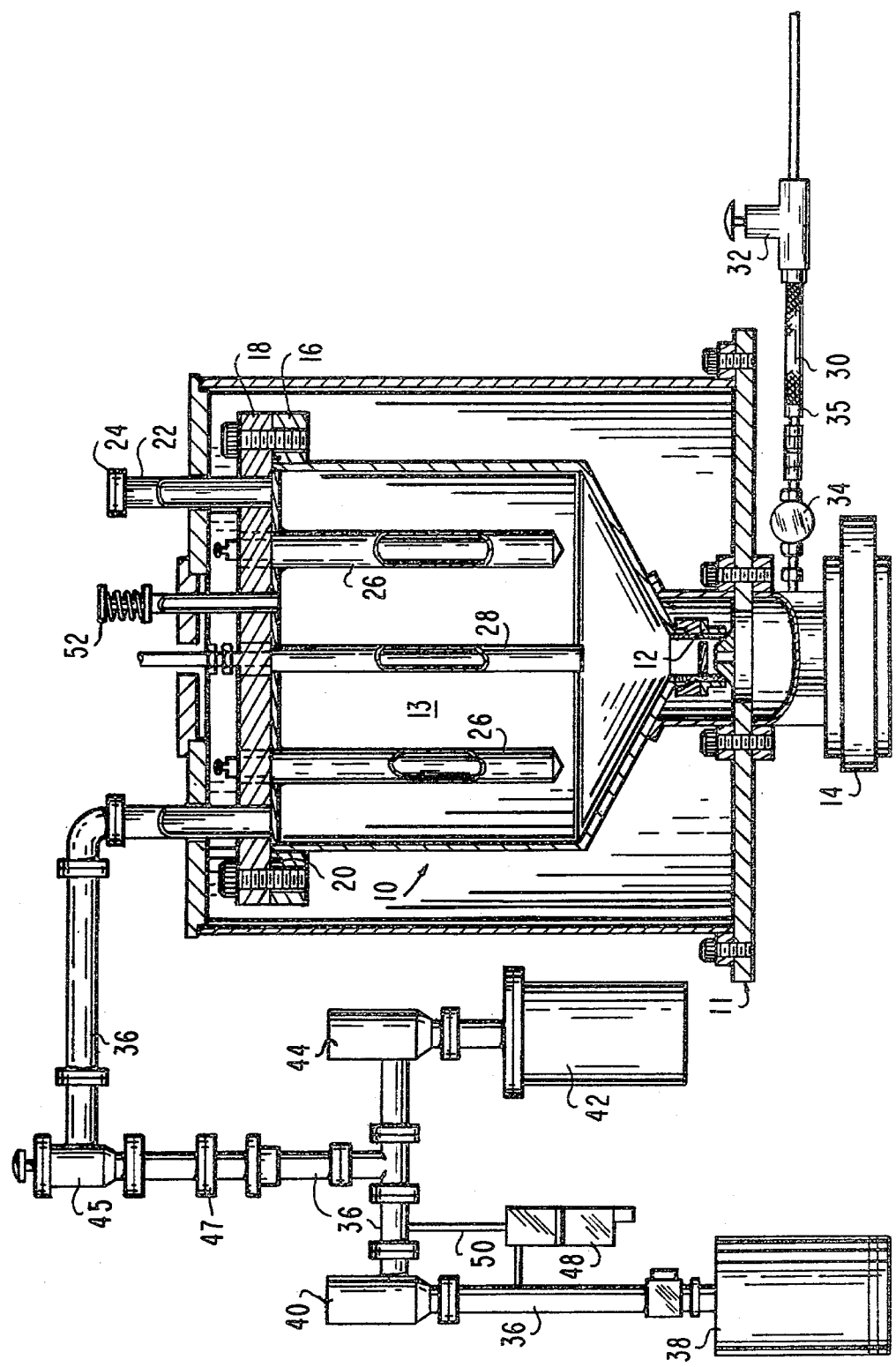

METHOD OF AND APPARATUS FOR OUTGASSING RAW MATERIAL USED TO GROW CRYSTALS

BACKGROUND OF THE INVENTION

This invention relates to a method of and apparatus for outgassing raw materials used to grow crystals and, more particularly, to such a method and apparatus useful when the grown crystal must be very pure. For example, in the electronics industry crystals are used as substrates for silicon to provide a wafer on which integrated circuits are formed. These crystal substrates must be free of internal voids and contaminants which adversely effect the electronic characteristics of the circuits.

Sapphire has become a widely used crystal as such a substrate. It is formed from aluminum oxide ($Al_2O_3$) granules or powder which are fed to a heated growth chamber having an inert atmosphere such as argon. Any water, air or other contaminants in the granules or powder are released in the growth chamber and become entrapped in the resultant crystal forming internal voids.

In order to minimize this problem, attempts have been made to outgas the granules or powder that is, to purify it by driving out water, air and other contaminants, before it is fed to the growth chamber. Such attempts have not provided the relatively high purity required by the electronics industry and/or have been time consuming so that they are not generally satisfactory.

One such technique is generally disclosed in U.S. Pat. No. 3,998,686 issued Dec. 21, 1976 to Meiling et al. This patent discloses the use of a double walled, water cooled bell jar sealed by elastomer or metal o-ring seals. The aluminum oxide is placed inside the bell jar and is then evacuated to about $5 \times 10^{-5}$ torr and heated to about 800° C. for a period of twenty-four hours to bake out the contaminants. Thereafter, the aluminum oxide is maintained in an inert atmosphere, first helium, then argon. In practice, this technique is time consuming and suffers from several problems. Moreover, it eliminates only about ninety-five percent of the contaminants.

SUMMARY OF THE INVENTION

This invention provides a high purity raw material from which high purity crystal can be grown. There is provided a hopper having a chamber in which the raw material is contained and which is associated with suitable internal heaters, a source of inert gas such as argon and at least two vacuum pumps, a mechanical pump and a cryogenic pump, each associated with a control valve. The source of inert gas is also associated with a control valve and all three control valves may be connected in a suitable control circuit along with the heaters to provide for the automatic operation of the system to carry out a method in accordance with this invention.

First, the raw material is fed into the hopper which is then sealed to provide a vacuum-tight chamber. Thereafter, the heaters are operated to heat the raw material to a relatively high temperature, for example, 800° C., over a period of time. Simultaneously, the mechanical pump is operated to evacuate the chamber to a first relatively low pressure, for example, about 200 millitorr during this time period. When the pressure in the chamber reaches the first relatively low pressure, the control valve associated with the inert gas feed is operated to backstream this gas through the chamber and the pump. When the temperature of the raw material reaches the relatively high temperature, that temperature and the first relatively low pressure are maintained for a first bake out period, for example, 3 to 5 hours. At the end of the first bake out period, the operation of the mechanical pump and backstreaming of the inert gas are discontinued and operation of the cryogenic pump is commenced to reduce the pressure further to a second relatively low pressure, for example, less than 5 millitorr. The relatively high temperature and the reduced second relatively low pressure are maintained for a second bake out period, for example, 3 to 5 hours. At the end of the second bake out period, the raw material has been sufficiently outgassed to remove substantially all of the contaminants and operation of the heaters and the cryogenic pump are discontinued.

The apparatus can be arranged so that the mechanical pump is operatively associated with a relatively small bypass line and a bypass valve. At start-up, the air and contaminants flow through the bypass line and valve until the pressure in the chamber drops to a pressure slightly above the first relatively low pressure, for example 500 millitor, at which time flow is through the normal line and control valve. This arrangement prevents the raw material from being sucked out of the chamber.

BRIEF DESCRIPTION OF THE DRAWING

For a better understanding of the invention, reference is made to the following description of a preferred embodiment thereof taken in conjunction with the FIGURE of the accompanying drawing which is a plan view of a system operating in accordance with this invention with a part thereof shown in section.

DETAILED DESCRIPTION OF A PREFERRED EMBODIMENT

Referring to the drawing, there is disclosed a system in accordance with this invention for outgassing aluminum oxide from which sapphire crystal will be grown. It should be understood that other raw material can be outgassed in accordance with this invention. The system includes a hopper 10 for the raw material and it is supported in a suitable cabinet or housing structure 11 of any conventional arrangement and configuration. The hopper 10 defines a chamber 13 that has a capacity of about 50 pounds (about 25 kilos) and is made of stainless steel to withstand the high temperatures to which it is subjected in use. Preferably, the inside wall of the hopper 10 is flame sprayed with aluminum oxide to prevent the contamination of the raw material. At its lower end the hopper 10 is funnel shaped so that the chamber 13 communicates with a discharge line 12 including a valve schematically shown at 14. When the apparatus is in use, the valve 14 is closed to seal the lower end of the hopper 10. After the material has been outgassed, the line 12 can be connected to a feeding apparatus (not shown) and the valve 14 can be opened to supply the feeding apparatus with relatively pure material. The feeding apparatus feeds the raw material to a crystal growth chamber in which it is processed or grown into a sapphire ribbon. For a detailed description of a preferred valve 14 and assembly, for connecting the hopper 10 to a feeding apparatus, reference is made to the copending application of Nicholas Francis Gubitose filed concurrently herewith and entitled APPARATUS FOR TRANSFERRING PURE ABRASIVE MATERIAL FROM ONE HOPPER TO ANOTHER (RCA Docket No. 75,426) Ser. No. 198,591 filed Oct. 20, 1980.

At its upper end the hopper 10 is formed with a flange 16 that cooperates with a cap 18 and a metal seal 20 to seal the upper end of the hopper. Use of a metal seal is preferred to enable the apparatus to remain vacuum-tight at the relatively high temperatures to which it will be subjected in use. A particular metal usable for this purpose is silver plated Inconel X750. Extending through the cap 18 and communicating with the chamber 13 is a feed pipe 22 through which raw material can be fed into the chamber. The end of the feed pipe 22 remote from the chamber 13 is sealed with a flange, cap and metal seal assembly denoted generally at 24 that is similar in structure and properties to the flange 16, cap 18 and seal 20.

Also extending through the cap 18 into the chamber 13 are a plurality of heaters 26. Preferably, there are six such heaters equally spaced apart around the midline defined between the center line of the hopper 10 and its outer wall. Because of their arrangement, only two heaters 26 can be seen in the drawing. The heaters 26 can be of any suitable and generally conventional type capable of heating the raw material in the hopper to a temperature of about 800° C. Also extending through the cap 18 into the chamber 13 is a thermocouple 28 for measuring the temperature of the raw material in the hopper 10. The thermocouple 28 can be any generally conventional and suitable apparatus that can be operatively connected in a control circuit for controlling the operation of the heaters 26 to maintain raw material in the chamber 13 at a relatively constant elevated temperature. As will be explained hereinafter, the output signal of the thermocouple 28 is also connected in a timer circuit for controlling various periods of operation of the system. If desired, an auger screw (not shown) can be arranged in the hopper 10 to circulate the raw material around the heaters 26 and provide for more uniform heating of the material.

Connected to the discharge line 12 upstream of the valve 14 and communicating with the chamber 13 is a feed line 30 connected to a source of inert gas, preferably argon, for a purpose to be explained hereinafter. The feed line 30 includes a flow metering valve 32 for controlling the flow rate of the gas to the hopper 10 and a normally closed flow valve 34 for permitting or preventing the flow of the gas to the hopper. Between the valves 32 and 34 is a quick disconnect coupling means 35 of any conventional type so that the hopper 10 can be disconnected from the source of argon. When disconnected, the normally closed valve 34 maintains the air tight integrity of the hopper. The metering valve 32 may be any such adjustable device and the flow valve 34 may similarly be any conventional open or closed valve so long as it can be operated by a control signal. Use of an air operated valve of the bellows type is a preferred type of valve 34.

A vacuum line 36 extends through the cap 18 and communicates with the chamber 13. This line 36 also communicates with vacuum pumps 38 and 42 through air operated normally closed valves 40 and 44, respectively. The pump 38 is a two-stage mechanical pump capable of creating a vacuum in the hopper 10 of at least about 200 millitorr; the pump 42 is an ultraclean cryogenic pump capable of reducing pressure in the hopper to less than about 5 millitorr, preferably to about 1 millitorr. Generally conventional and readily available pumps can be utilized. Both valves 40 and 44 are of the type that can be air operated by a suitable control signal and are preferably of the bellows type.

Interposed in the line 36 between the hopper 10 and the valves 40 and 44 is a valve 45 that prevents or permits flow between the hopper and the first mentioned valves. This valve 45 is normally manually operated and is open when the system is operating to outgas material. Between the valve 45 and the valves 40 and 44 is a quick disconnect coupling means 47 which can disconnect the valves 40 and 44 from the hopper. When disconnected, the valve 45 is closed. A normally closed bypass valve 48 is located in a relatively small bypass line 50 that communicates between the inlet and discharge side of the valve 40. This valve 48 is also a pneumatic operated valve, preferably of the bellows type. When the vacuum system is started, this bypass valve 48 is opened while the valves 40 and 44 are closed so that the vacuum flow is through the conduit 36 and the relatively small bypass line 50. By appropriately sizing the bypass line 50 the initial vacuum flow is very low and granules of raw material are not sucked from the hopper to the pump 38. Aluminum oxide is a very abrasive material that could, on contact, damage the mechanical pump 38. In practice, line 36 is about a $1\frac{1}{2}''$ diameter conduit so that the initial vacuum flow would be large sucking granules from the chamber 13; bypass line 50 is only about a $\frac{1}{4}''$ diameter line so that the initial vacuum flow is relatively low and will not suck tne granules from the chamber. As will be explained hereinafter, when the initial suction phase is complete, the bypass valve 48 closes and the valve 40 opens so that flow is not restricted.

A method in accordance with this invention will be explained with reference to the description of the system in accordance with this invention. Aluminum oxide or other raw material is introduced into the chamber 13 defined by the hopper 10 through the load pipe 22 and the load pipe is then sealed via the cap assembly 24. Of course, the valves 14 and 34 are closed to further seal the chamber 13 while the valve 45 is open to provide communication from the chamber to the closed valves 40, 44 and 48. The heaters 26 are energized to commence heating the raw material and at the same time, the two-stage mechanical pump 38 is operated and the bypass valve 48 is opened. Thus, heating of the raw material commences as does the outgassing of the chamber 13. The initial suction is sufficiently high at start up to suck a large volume of water, air and other contaminants from the chamber 13, but is not so high as to suck granules of the raw material from the chamber. At a pressure of about 500 millitorr, the bypass valve 48 is closed and the valve 40 is open so that the flow is through the conduit 36 and the valve 40 to the vacuum pump 38. When the pressure in the chamber 13 reaches about 200 millitorr, the flow control valve 34 is opened so that the inert gas is fed to the chamber. This gas is, of course, pulled through the material in the chamber 13 and the conduit 36 to the vacuum pump 38. The metering valve 32 is adjusted so that the feed rate of the inert gas is approximately equal to the exhaust rate of the mechanical pump whereby a relatively constant pressure of 200 millitorr is maintained in the chamber 13.

An inert gas is streamed into the chamber 13 because with mechanical vacuum pumps operating at 200 millitorr or less, oil molecules can be backstreamed into the chamber. Without the inert gas, these oil molecules in the chamber 13 would contact and contaminate the raw material. Because of the flow of the inert gas these oil molecules are discharged through the pump to the atmosphere and, thus, do not flow into the chamber 13.

When the temperature of the raw material in the chamber 13 reaches 800° C., the heaters are turned off and are thereafter operated intermittently to maintain the material at a relatively constant temperature of 800° C. The thermocouple 28 measures the temperature of the raw material and can feed an output signal to a control circuit that operates the heaters 26 when the temperature falls below 800° C. and that shuts them off when the temperature reaches 800° C. The temperature is maintained at 800° C. and the pressure in the chamber 13 is maintained at 200 millitorr for a period of time sufficient to bake out most of the oxygen, water and other contaminants in the raw material. Usually, the constant temperature and pressure are maintained for a bake out period of about 3 to 5 hours.

At the end of this first time period, with the temperature of the raw material still maintained at a relatively constant 800° C., the valve 40 is closed and operation of the pump 38 is discontinued. Simultaneously, the flow control valve 34 in the inert gas feed line 30 is closed so that the flow of inert gas to the chamber 13 is discontinued. Now, the cryogenic pump 42 is operated and the valve 44 is opened so that the pressure in the chamber 13 is reduced to about 5 millitorr or less and preferably to about 1 millitorr. Use of a cryogenic pump is preferred because it is ultra-clean, having no moving parts, and will not introduce contaminants into the chamber 13. One such pump usable with this invention is the CRY-TORR 8 pump manufactured by CTI Cryogenic. This pump is capable of providing pressures as low as $10^{-6}$ millitorr at relatively high speed. The material is maintained at a temperature of 800° C. and a pressure of less than 5 millitorr for a second bake out period, again, for about 3 to 5 hours. This additional bake out time will further reduce the amount of oxygen, water and other impurities in the raw material so that the material is virtually free of these contaminants. A purity of at least 97% is obtainable with this invention.

At the end of the second bake out time, operation of the heaters 26 is discontinued and the valve 44 is closed so that the raw material can cool down. The valve 45 is also closed and the hopper 10 is disconnected from the vacuum system. The chamber 13 can be maintained as a vacuum; preferably, however, the flow control valve 34 is reopened so that an atmosphere of inert gas is fed into the chamber 13 to help prevent recontamination of the raw material. Preferably this flow of inert gas is maintained until it is desired to feed the material to the crystal growing apparatus. Accordingly, a pressure relief valve 52 is operatively associated with the hopper 10 to maintain the gas in the chamber 13 at a relatively constant pressure. When it is desired to feed the raw material to the crystal growing apparatus, the valve 34 is closed, the line 12 is then connected to the crystal growing apparatus and the valve 14 is opened to allow the flow of raw material from the chamber 13 to the apparatus.

An automatic control system can be beneficially associated with the system to operate the heaters 26 and automatically open and close the various valves at the appropriate times. Such a system would include a pressure measuring device in the chamber 13 which would feed signals to the control system along with signals from the thermocouple 28. Comparison circuits with set point reference signals and timer circuits would also be included along with an electric-pneumatic interface to control the operation of the various bellow valves. Such a control system is comprised of elements well known in the art and need not be described further herein.

While in the foregoing there has been described a preferred embodiment of a system and method in accordance with this invention, it should be understood by those skilled in the art that various changes and modifications can be made without departing from the true spirit and scope of the invention as recited in the appended claims.

We claim:

1. A method of outgassing raw material comprising the steps of:
    feeding the raw material into a chamber and sealing said chamber;
    heating the raw material to a relatively high temperature over a period of time and evacuating said chamber to a first relatively low pressure during said first period of time;
    feeding an inert gas to said chamber at said first relatively low pressure; maintaining said first relatively low pressure and said relatively high temperature for a first bake out period during which contaminants are removed from the raw material; and,
    thereafter discontinuing the feeding of an inert gas to said chamber and reducing the pressure therein to a second relatively low pressure less than said first relatively low pressure and maintaining said second relatively low pressure and said relatively high temperature for a second bake out period during which additional contaminants are removed from the raw material.

2. A method in accordance with claim 1 wherein said first relatively low pressure is about 200 millitorr.

3. A method in accordance with claim 1 wherein said second relatively low pressure is equal to or less than about 5 millitorr.

4. A method in accordance with claim 1 wherein said relatively high temperature is about 800° C.

5. A method in accordance with claim 1 wherein said first bake out period is about 3 to 5 hours.

6. A method in accordance with claim 1 wherein said second bake out period is about 3 to 5 hours.

7. A method in accordance with claim 1 wherein said relatively high temperature is about 800° C., said first relatively low pressure is about 200 microns, said second relatively low pressure is equal to or less than about 5 microns and said first and second bake out periods are no less than about 3 hours and no greater than about 5 hours.

8. A method in accordance with claim 1 wherein said inert gas is fed to said chamber at a rate equal to the evacuation rate to maintain the pressure therein relatively constant.

9. Apparatus for outgassing raw material comprising a sealed hopper adapted to contain raw material, said hopper being operatively associated with heater means for heating raw material therein to an elevated temperature, first vacuum pump means associated with said hopper for evacuating said hopper to a first relatively low pressure and second vacuum pump means associated with said hopper for evacuating said hopper to a second relatively low pressure than said first relatively low pressure and means for feeding an inert gas to said hopper and through said first vacuum pump means at said first relatively low pressure.

10. Apparatus in accordance with claim 9 including conduit means between said hopper and said first and second vacuum pump means, first valve means between said hopper and said first vacuum pump means and second valve means between said hopper and said second vacuum pump means, said first and second valve means being operative to selectively connect their associated vacuum pump means to said hopper.

11. Apparatus in accordance with claim 10 including bypass conduit means between the inlet and discharge sides of said first valve means, said bypass conduit means having a smaller diameter than said conduit means and a bypass valve means in said bypass conduit.

12. Apparatus in accordance with claim 10 wherein said first vacuum pump means is a mechanical pump and said second vacuum pump means is a cryogenic pump.

* * * * *